United States Patent
Kawasaki

(10) Patent No.: US 7,275,187 B2
(45) Date of Patent: Sep. 25, 2007

(54) TEST CIRCUIT FOR MEMORY

(75) Inventor: Tatsuya Kawasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 324 days.

(21) Appl. No.: 10/646,868

(22) Filed: Aug. 25, 2003

(65) Prior Publication Data
US 2004/0151017 A1    Aug. 5, 2004

(30) Foreign Application Priority Data
Aug. 30, 2002    (JP)    ............................. 2002-253329

(51) Int. Cl.
*G11C 29/10*    (2006.01)
*G11C 29/40*    (2006.01)

(52) U.S. Cl. ...................... 714/718; 714/702

(58) Field of Classification Search ................ 714/718, 714/25, 42, 54, 702, 763; 365/200, 201
See application file for complete search history.

(56) References Cited

U.S. PATENT DOCUMENTS

| | | | | |
|---|---|---|---|---|
| 4,446,514 A | * | 5/1984 | Brown et al. ................. | 712/32 |
| 4,821,238 A | * | 4/1989 | Tatematsu .................... | 365/201 |
| 5,668,815 A | * | 9/1997 | Gittinger et al. ............. | 714/719 |
| 5,883,844 A | * | 3/1999 | So .............................. | 365/201 |
| 5,987,635 A | * | 11/1999 | Kishi et al. .................. | 714/724 |
| 6,034,907 A | * | 3/2000 | Haraguchi ................... | 365/201 |
| 6,473,873 B1 | * | 10/2002 | Akamatsu et al. ........... | 714/738 |
| 2001/0056557 A1 | * | 12/2001 | Kawagoe et al. ............ | 714/723 |
| 2002/0049940 A1 | * | 4/2002 | Giaume et al. .............. | 714/718 |
| 2002/0093862 A1 | | 7/2002 | Akioka | |
| 2003/0120974 A1 | * | 6/2003 | Adams et al. ................ | 714/31 |

FOREIGN PATENT DOCUMENTS

| | | | |
|---|---|---|---|
| JP | 02216565 A | * | 8/1990 |
| JP | 2001-297598 A | | 10/2001 |
| JP | 2002/042493 A | | 2/2002 |
| JP | 2002100200 A | * | 4/2002 |

OTHER PUBLICATIONS

Patent Abstracts of Japan, vol. 2002, No. 02, Apr. 2, 2002, Abstract only.

* cited by examiner

*Primary Examiner*—Cynthia Britt
*Assistant Examiner*—Dipakkumar Gandhi
(74) *Attorney, Agent, or Firm*—Foley and Lardner LLP

(57) ABSTRACT

Each signal generating circuit for generating a CS signal, an address signal, a data signal or an R/W signal of a memory to be tested, and a test setting control circuit for generating a control data of these signal generating circuits are provided. The signal generating circuits and the test setting control circuit have shift registers, and a control data and a test data are serially input to these shift registers from external terminals.

13 Claims, 8 Drawing Sheets

FIG. 2

| CONTROL SIGNAL | | | | OPERATION MODE | OPERATION CONTENTS |
|---|---|---|---|---|---|
| 34 | 33 | 32 | 31 | | |
| 0 | 0 | 0 | 0 | | NO OPERATION |
| 0 | 0 | 0 | 1 | | RESERVED |
| 0 | 0 | 1 | x | TEST SETTING | SHIFT SR OF SIGNAL GENERATING CIRCUITS 510-530 AND Inc/Dec CONTROL CIRCUIT 522. INPUT IS CONTROL SIGNAL 31. |
| 0 | 1 | 0 | x | TEST SETTING | SHIFT SR OF TEST SETTING CONTROL CIRCUIT 560. INPUT IS CONTROL SIGNAL 31. |
| 0 | 1 | 1 | x | | RESERVED |
| 1 | 0/1 | x | x | TEST EXECUTION | CONTROL OF PRESENCE OR ABSENCE OF ADDRESS Inc(Dec). 1: PRESENCE  0: ABSENCE |
| 1 | x | 0/1 | x | TEST EXECUTION | CONTROL OF R/W.  1: W(WRITE)  0: R(READ) |
| 1 | x | x | 0/1 | TEST EXECUTION | CONTROL OF PRESENCE OR ABSENCE OF DATA REVERSE. 1: REVERSE  0: NON-REVERSE |

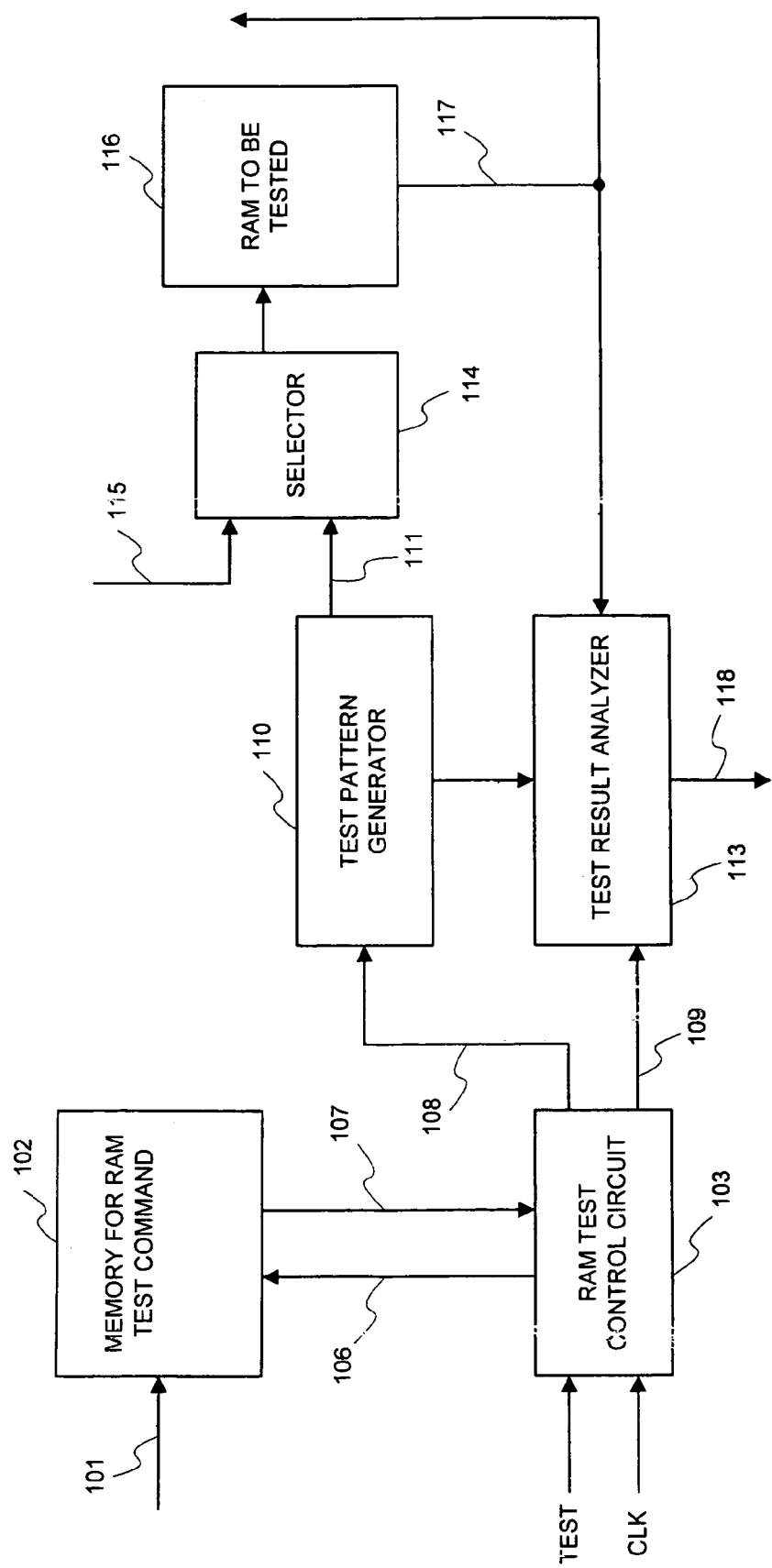

TEST CIRCUIT FOR MEMORY

BACKGROUND OF THE INVENTION

The present invention relates to a test circuit for a memory, and especially, to a test circuit for a memory of a semiconductor integrated circuit in which a memory and a logic section are mixedly loaded on one semiconductor chip.

In recent years, various kinds of LSIs in which a memory is mixedly loaded in a logic section such as an ASIC and a microprocessor have been proposed. In this kind of LSI, a normal operation of the memory is controlled by a signal from the logic section, and for example, when a read command is issued from the logic section, the memory outputs a data of a selected address to the logic section. Similarly, the memory outputs the data of the selected address to the logic section. In this kind of LSI, since to conduct a test of the memory through the complicated logic section is impractical, various exclusive test circuits for conducting a test of the memory have been proposed.

FIG. 10 is a view showing an arrangement of a conventional test circuit for a memory (Refer to a patent document 1 (JP-P2002-42493A (FIG. 5)).). In FIG. 10, 211 is a memory circuit that is an object of a test of the memory, and has a plurality of data input terminals DI and a plurality of data output terminals DO. 212 is an internal logic circuit having an external input terminal NI, and 213 and 214 are selectors, respectively, each of which switches input terminals A and B to each other by means of a switch control signal from a test mode terminal TEST.

Next, an operation will be explained. In case of writing a normal data, by means of a switch control signal from the test mode terminal TEST, both of the selectors 213 and 214 select the input terminals A. The normal data is input from the external input terminal NI, and is written into the memory circuit 211 from the data input terminal DI via the internal logic circuit 212 and the selector 213. Also, in case of reading the normal data, it is output from the data output terminal DO of the memory circuit 211 to an external output terminal OUT via the internal logic circuit 212 and the selector 214.

In case of writing a test data, by means of the switch control signal from the test mode terminal TEST, both of the selectors 213 and 214 select the input terminals B. The test data is input from a test input terminal TI, and is written into the memory circuit 211 from the data input terminal DI via the selector 213. Also, in case of reading the test data, it is output from the data output terminal DO of the memory circuit 211 to the external output terminal OUT via the selector 214.

In conducting a test of the memory, by means of the switch control of the selectors 213 and 214, such a conventional test circuit of the memory can conduct the test of the memory of a single piece of the memory circuit 211 without involving the internal logic circuit 212.

As a prior art of other test circuit of a memory, there is one known as a built-in self-test circuit (BIST circuit). While, in the above-mentioned test circuit of the memory, all of the generation of a test pattern and the analysis of an output data are conducted by an external tester, in the BIST circuit, a test pattern generator and a test result analyzer are provided, and only a determination result of the test is output to an external tester. Accordingly, in the BIST circuit, there is a merit that the number of terminals for the test, which are necessary for an LSI, requires a small number.

However, in the general BIST circuit, a sequencer is provided inside the memory test circuit, and since the sequencer controls test contents, the test contents are fixed, and it is impossible to change the test contents after a design of the LSI.

Accordingly, as a method of making it possible to change the test contents even after the design of the LSI, a programmable BIST circuit is considered. FIG. 11 is an arrangement view of a programmable BIST circuit that can be generally considered. To a memory 102 for a RAM test command, a program data 101 representing algorithm for generating the test contents is input from an external input terminal, and is stored therein. When a test mode setting signal TEST becomes predetermined logic, a RAM test control circuit 103 is set to a test mode, and operates in synchronization with a RAM test clock CLK, and provides an address specification signal 106 to the memory 102 for a RAM test command, and sequentially reads a program data 107 from the memory 102 for a RAM test command.

A test pattern generator 110 sequentially generates a test pattern data 111 corresponding to the program data in accordance with a control signal 108 output from the RAM test control circuit 103. The test pattern data 111 is switched to a signal 115 during a normal operation by means of a selector 114, and is selected as an input data to a memory 116 to be tested.

In such a programmable BIST circuit, by changing the program data being held in the memory for a RAM test command, it is possible to perform an arbitrary RAM test. Also, to avoid an area increase due to the RAM test command memory, a method has been proposed, in which a scan path register inside an LSI is substituted for the RAM test command memory (Refer to a patent document 2 (JP-P2001-297598A (FIG. 1)).).

In the method wherein, by means of conducting the switch control of the selector, the test of the memory circuit is conducted without involving the internal logic circuit, the terminals for a test, which corresponds to the numbers of the data input terminals and the data output terminals, are required. Accordingly, in case that a bit width of a data input or a data output is large or in case that a plurality of memories is integrated, there is a defect that a number of terminals for a test are required, which becomes impractical.

In the general BIST circuit, a sequencer is provided inside the circuit, and since the sequencer controls test contents, the test contents are fixed, and it is impossible to change the test contents after a design of the LSI. On the other hand, in the BIST circuit as shown in FIG. 11, the increase of an area due to the incorporation of the memory for a RAM test command inside the LSI, and a test of the memory itself for a RAM test command also become a problem. In the BIST circuit proposed in the patent document 2, although the increase of an area due to the addition of the memory for a RAM test command does not occur, the increase of an area due to signal lines or the like for drawing a program from the scan path register inside the LSI, which is used as the substitution for the memory for a RAM test command, and the deterioration of a wiring characteristic during layout become a problem. Also, since these test circuits generate a test pattern from a program, there is a defect that, in the RAM test control circuit and the test pattern generator, a circuit for conducting the decode of a program, the generation of a control signal of the RAM or the like is required, and a circuit size becomes larger.

SUMMARY OF THE INVENTION

The present invention was made to solve the above-described tasks, and the objective thereof is to realize a test circuit for a memory, in which test contents can be changed, by means of the addition of minimum external terminals for a test and circuits.

A test circuit for a memory of the present invention is constructed so that, in a test circuit which is incorporated into a semiconductor integrated circuit together with the memory, the test circuit has a test signal generating circuit for generating a test signal for said memory, and a control circuit for conducting control of said test signal generating circuit, and a test setting mode and a test execution mode are switched to each other in accordance with a first control signal input from outside, and an initial data of the test signal and a control data for controlling said test signal generating circuit, which are input to said test signal generating circuit in said test setting mode, and a control data to said control circuit are input serially from an identical terminal.

In the present invention, since it is constructed so that the test setting mode and the test execution mode are switched to each other in accordance with the first control signal input from outside, and the initial data of the test signal and the control data for controlling said test signal generating circuit, which are input to said test signal generating circuit in said test setting mode, and the control data to said control circuit are input serially from the identical terminal, it is possible to change the test contents of the memory by means of a small number of external terminals.

BRIEF DESCRIPTION OF THE DRAWINGS

This and other objects, features and advantages of the present invention will become more apparent upon a reading of the following detailed description and drawings, in which:

FIG. 2 is a view in which an operation of the test circuit for the memory by means of a combination of test control signals in accordance with an embodiment of the present invention is summarized;

FIG. 11 is a view showing an arrangement of a test circuit for a memory in accordance with a second prior art.

DESCRIPTION OF THE EMBODIMENTS

Hereinafter, referring to drawings, the present invention will be explained further in detail based on embodiments of the present inventions.

Figure 1:
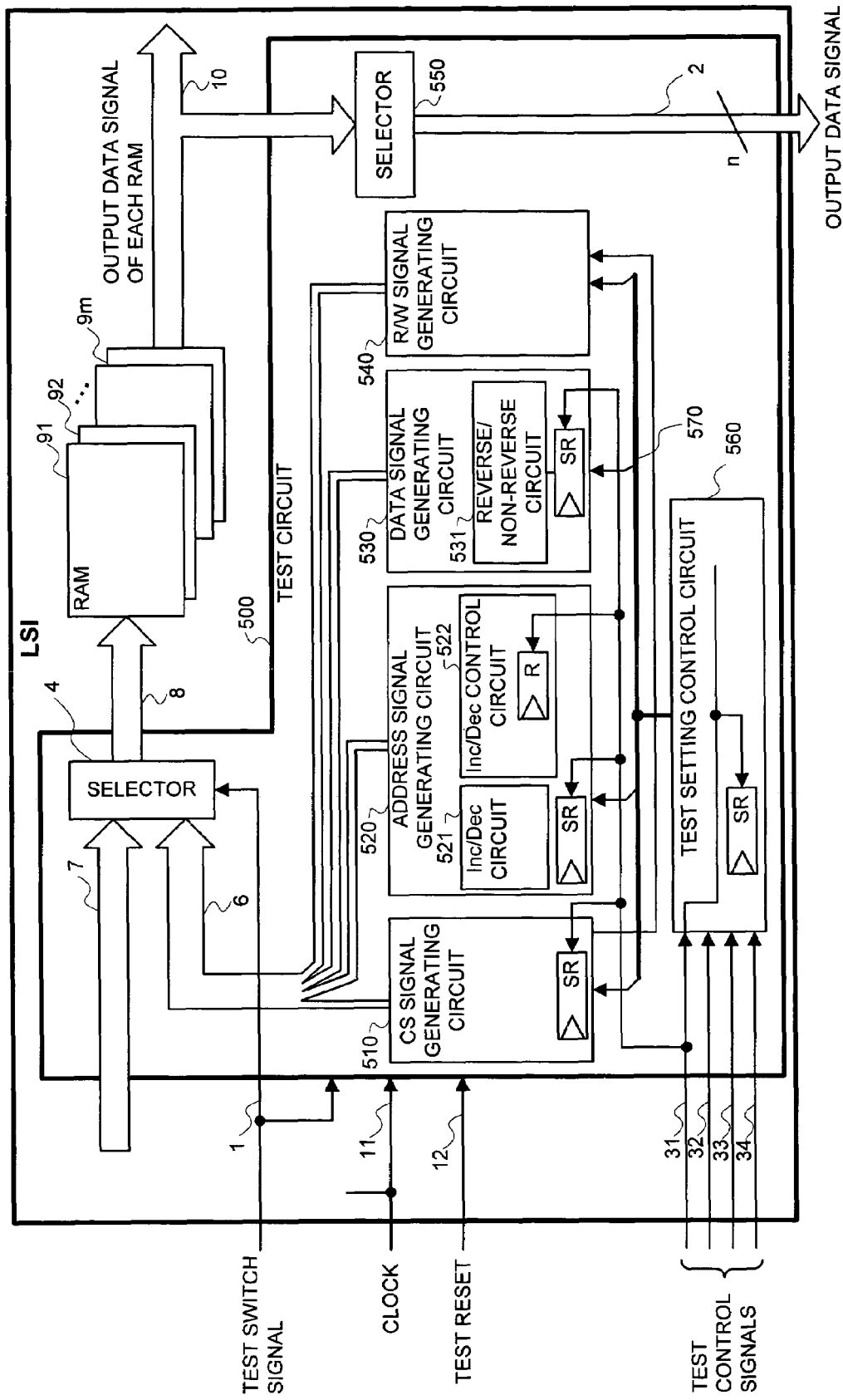
FIG. 1 is a view showing an arrangement of an LSI in which a test circuit for a memory in accordance with an embodiment of the present invention is integrated.

FIG. 1 shows an arrangement of an LSI having a test circuit for a memory in relation to an embodiment of the present invention. The LSI to which the test circuit for the memory of the present invention is applied has a plurality of RAM 91-9$m$ and a test circuit 500.

An output 6 of the test circuit 500 is a data signal, an address signal, a chip select (CS) signal and a read/write (R/W) signal that are input signals to each of the RAM 91-9$m$ during a test, and is connected to one of the inputs of a selector 4, and to the other of the inputs of the selector 4, the data signal, the address signal, the CS signal and the R/W signal are connected as an input signal 7 to each of the RAM 91-9$m$ during a normal operation.

The selector 4 switches the signals 6 and 7 to each other by means of a test switch signal 1 input from an external terminal, and an output signal 8 thereof is input to each of the RAM 91-9$m$. The RAM selected by the CS signal conducts reading or writing of a data by means of a value of the R/W signal.

An output from each of the RAM 91-9$m$ is also input to the test circuit 500, and an output data of the RAM selected by a selector 550 is output to the outside from the LSI as an output data signal 2.

The test circuit 500 is constructed of the selector 4, a CS signal generating circuit 510 for generating a CS signal of the RAM, an address signal generating circuit 520 for generating an address signal of the RAM, a data signal generating circuit 530 for generating a write data to the RAM, an R/W signal generating circuit 540 for generating an R/W signal to the RAM, the selector 550 for selecting an output signal from the selected RAM by means of the CS signal, and a test setting control circuit 560 for controlling the values or the like of the CS signal, the address signal and the data signal of the RAM. Test control signals 31-34 from a control terminal of the LSI are input to the test setting control circuit 560.

Output signals from the CS signal generating circuit 510, the address signal generating circuit 520, the data signal generating circuit 530 and the R/W signal generating circuits 540 that are a test signal generating circuit of the present invention are output to the selector 4 as a test signal 6 to each RAM.

The address signal generating circuit 520 has an Inc/Dec circuit 521 for conducting the increment/decrement (Inc/Dec) of the address signal to the RAM, and an Inc/Dec control circuit 522 for controlling it (selecting Inc or Dec).

The data signal generating circuit 530 has a reverse/non-reverse circuit 531 for conducting reverse/non-reverse of the write data to the RAM.

The CS signal generating circuit 510, the address signal generating circuit 520, the data signal generating circuit 530 and the test setting control circuit 560 have shift registers (SR). The Inc/Dec control circuit 522 has a register (R). The test control signal 31 that becomes a data for setting a value is input to these SR and R. In flip-flops constituting these SR and R, a test rest signal 12 to be input from an external terminal is input thereto in advance, and thereby, an initial value 0 is set.

Figure 5:
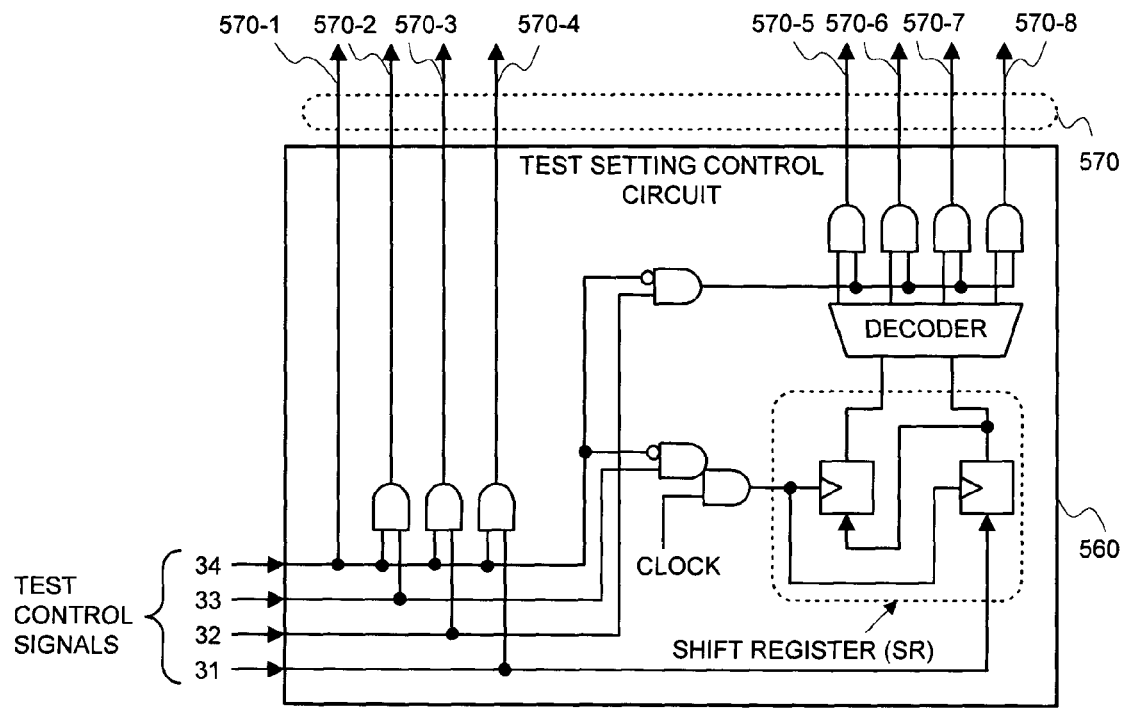
FIG. 5 is a view showing an arrangement example of a test setting control circuit of the test circuit for the memory in accordance with an embodiment of the present invention.

An arrangement example of the test setting control circuit 560 is shown in FIG. 5. The test setting control circuit 560 conducts the selection of the SR of the CS signal generating circuit 510, the SR of the address signal generating circuit 520, the SR of the data signal generating circuit 530 and the R of the Inc/Dec control circuit 522, and the control of the operations of the CS signal generating circuit 510, the address signal generating circuit 520, the data signal generating circuit 530 and the R/W signal generating circuits 540.

In FIG. 5, signals 570-5-570-8 are selection signals of the SR of the CS signal generating circuit 510, the SR of the address signal generating circuit 520, the R of the Inc/Dec control circuit 522, and the SR of the data signal generating circuit 530, respectively. The selection signals 570-5-570-8 are generated by decoding a value of each flip-flop (F/F) constituting the SR in a decoder. Also, the selection signals 570-5-570-8 become active when the test control signal 34 is 0 and the test control signal 32 is 1. The setting of the value of this SR is conducted by giving 0 to the test control signal 34, giving 1 to the test control signal 33, assuming the test control signal 31 as a serial input, and latching the value in synchronization with a clock 11 input from the external terminal common to other logic section of the LSI. Signals 570-1-570-4 are control signals of the CS signal generating circuit 510, the address signal generating circuit 520, the data signal generating circuit 530 and the R/W signal generating circuit 540, respectively. The control signals 570-1-570-4 become effective when the test control signal 34 is 1.

Figure 6:
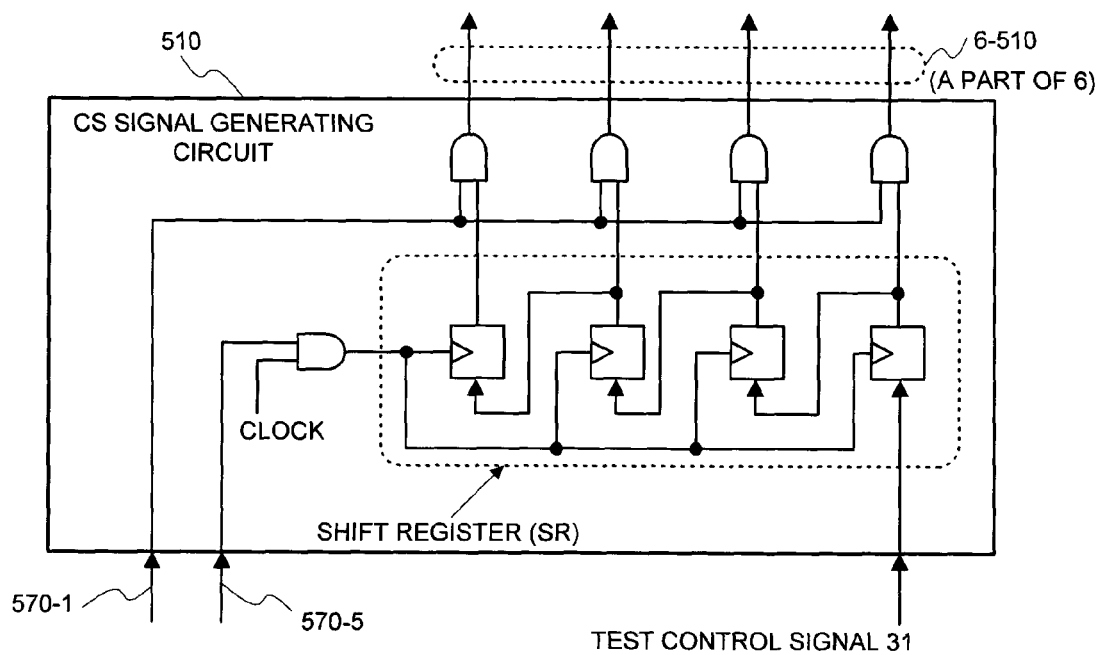
FIG. 6 is a view showing an arrangement example of a CS signal generating circuit of the test circuit for the memory in accordance with an embodiment of the present invention.

An arrangement example of the CS signal generating circuit 510 is shown in FIG. 6. This figure shows a case in which there are four RAMs. The CS signal generating circuit 510 generates a CS signal based on a value of the F/F constituting the SR of the CS signal generating circuit 510. The setting of a value of the SR is conducted by, after setting a value of the SR of the test setting control circuit 560, giving 0 to the test control signal 34 and giving 1 to the test control signal 32 to make the selection signal 570-5 active, and assuming the test control signal 31 as a serial input, and latching the value in synchronization with the clock 11. A CS signal 6-510 output from the CS signal generating circuit 510 is output by giving 1 to the test control signal 34 to make the control signal 570-1 active.

Figure 7:
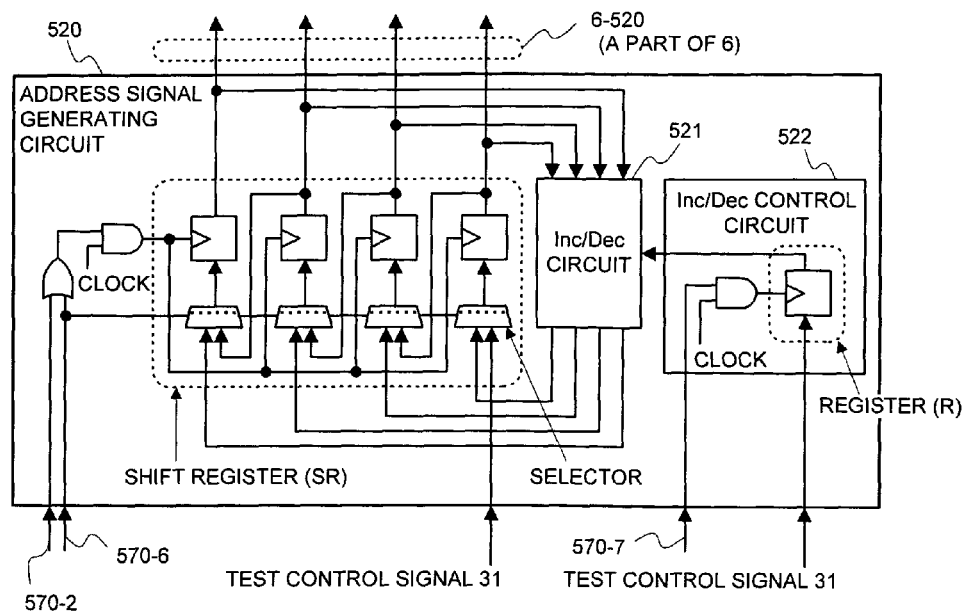
FIG. 7 is a view showing an arrangement example of an address signal generating circuit of the test circuit for the memory in accordance with an embodiment of the present invention.

An arrangement example of the address signal generating circuit 520 is shown in FIG. 7. This figure shows a case in which an address line has a 4 bit width. The address signal generating circuit 520 generates an address signal based on a value of the SR of the address signal generating circuit 520. The setting of a value of the SR, which becomes an initial address value, is conducted by, after setting a value of the SR of the test setting control circuit 560, giving 0 to the test control signal 34 and giving 1 to the test control signal 32 to make the selection signal 570-6 active, and assuming the test control signal 31 as a serial input, and latching the value in synchronization with the clock 11. The SR of the address signal generating circuit 520 has a selector for making shift-register connection of each F/F constituting the SR only during a period of time when the selection signal 570-6 for setting the initial address is active, and for writing an address signal output from the Inc/Dec 521 into each of these flip-flops in parallel during the test execution.

The Inc/Dec control circuit 522 generates an Inc/Dec control signal based on a value of the register (R) of the Inc/Dec control circuit 522, and based on this value, the Inc/Dec circuit 521 switches the Inc and Dec to each other. The setting of a value of the R is conducted by, after setting a value of the SR of the test setting control circuit 560, giving 0 to the test control signal 34 and giving 1 to the test control signal 32 to make the selection signal 570-7 active, and assuming the test control signal 31 as a serial input, and latching the value in synchronization with the clock 11.

In an address signal 6-520 output from the address signal generating circuit 520, a value of each flip-flop of the SR is output. The address signal 6-520 is input to the Inc/Dec circuit 521, and the Inc/Dec circuit 521 conducts the Inc/Dec of the address signal 6-520 and outputs it. Also, when the control signal 570-2 becomes active by giving 1 to the test control signal 34 and giving 1 to the test control signal 33, an output from the Inc/Dec circuit 521 is written into each flip-flop of the SR of the address signal generating circuit 520 in parallel (The Inc/Dec of the address signal is conducted.). When the control signal 570-2 is not active, a value of the SR of the address signal generating circuit 520 (the address signal) does not change.

Figure 8:
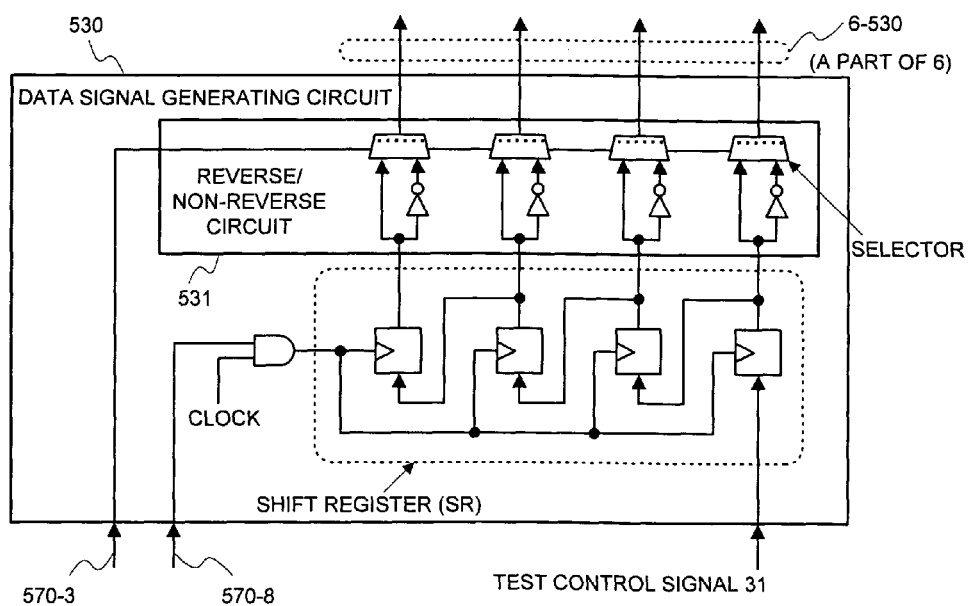
FIG. 8 is a view showing an arrangement example of a data signal generating circuit of the test circuit for the memory in accordance with an embodiment of the present invention.

An arrangement example of the data signal generating circuit 530 is shown in FIG. 8. This figure shows a case in which a data line has a 4 bit width. The data signal generating circuit 530 generates a data signal that becomes a write data to the RAM, based on a value of each F/F of the SR of the data signal generating circuit 530. The setting of a value of the SR is conducted by, after setting a value of the SR of the test setting control circuit 560, giving 0 to the test control signal 34 and giving 1 to the test control signal 32 to make the selection signal 570-8 active, and assuming the test control signal 31 as a serial input, and latching the value in synchronization with the clock 11.

The reverse/non-reverse circuit 531 receives the value of each F/F of the SR of the data signal generating circuit 530, and outputs a data in which the value of each F/F of the SR is reversed, when the control signal 570-3 becomes active by giving 1 to the test control signal 34 and giving 1 to the test control signal 32, and outputs a non-reversed data when the control signal 570-3 is not active. A data signal 6-530 output from the data signal generating circuit 530 is an output from the reverse/non-reverse circuit 531.

Figure 9:
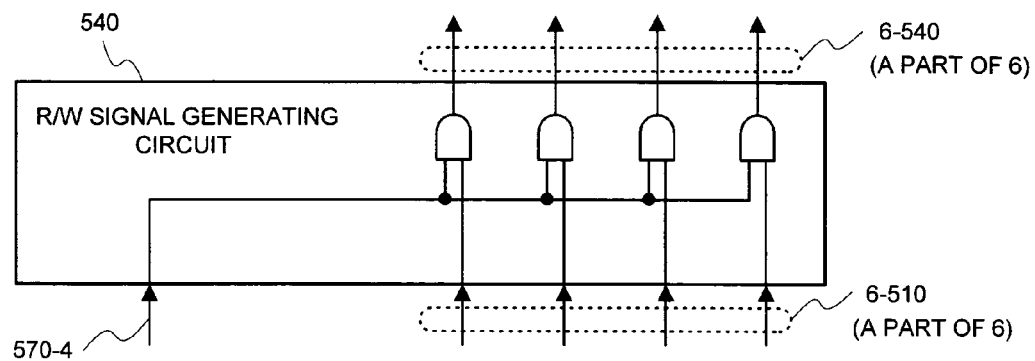
FIG. 9 is a view showing an arrangement example of an R/W signal generating circuit test setting control circuit of the test circuit for the memory in accordance with an embodiment of the present invention.
Figure 10:
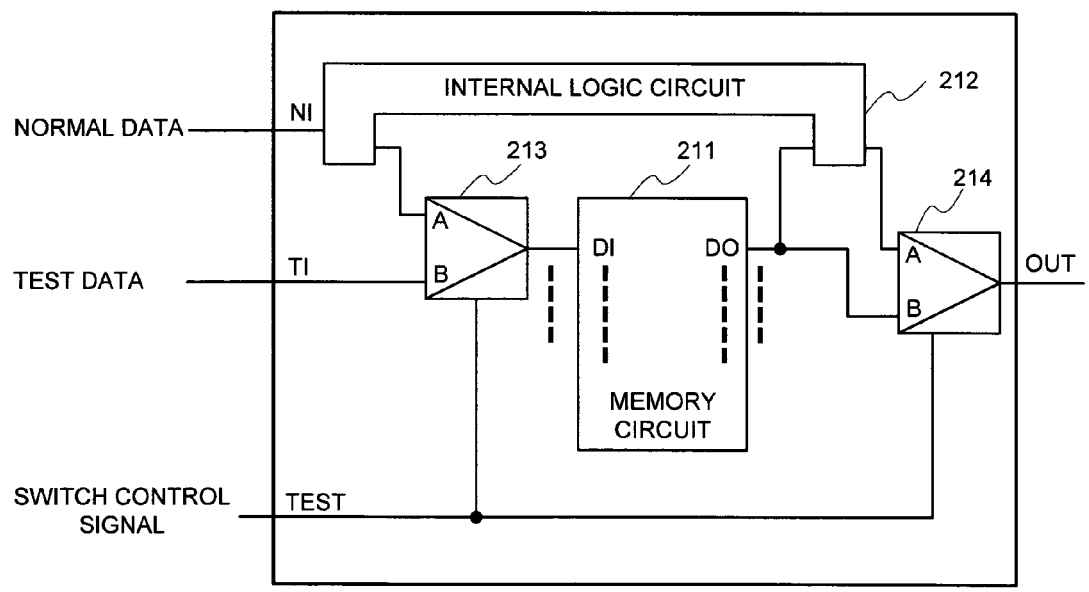
FIG. 10 is a view showing an arrangement of a test circuit for a memory in accordance with a first prior art.

An arrangement example of the R/W signal generating circuit 540 is shown in FIG. 9. This figure shows a case in which there are four RAMs. The R/W signal generating circuit 540 makes an output based on an output 6-510 from the CS signal generating circuit 510. With regard to an R/W signal 6-540 output from the R/W signal generating circuit 540, 1 (write) is output by giving 1 to the test control signal 34 and giving 1 to the test control signal 31 to make the control signal 570-4 active, and 0 (read) is output when the control signal 570-4 is not active.

Next, an operation of this embodiment will be explained. The operation of the test circuit 500 is broken down into two of a "test setting" and "test execution". The switching of the "test setting" and the "test execution" is conducted by the test control signal 34.

First, an operation of the "test setting" will be explained. The operation of the "test setting" is to perform the selection of the RAM to be tested (the determination of a value of CS), the determination of a test start address value, the selection of the Inc or the Dec of an address value, and the determination of a value of a write data. Since the CS signal, the address signal, the selection of the Inc or Dec of the address, and the data signal are generated by means of values of the SR (shift registers) or the R (register) of the CS signal generating circuit 510, the address signal generating circuit 520, the Inc/Dec control circuit 522 and the data signal generating circuit 530, it is work in the "test setting" to set up the values of these SR or R.

A flow of the "test setting" will be shown below. 1. 0 is given to the test control signal 34. 2. 1 is given to the test control signal 33, and the value of the SR of the test control circuit 560 is set by assuming the test control signal 31 as a serial input, and the SR or R (Here, the SR of the CS signal generating circuit 510, the address signal generating circuit 520 and the data signal generating circuit 530, and the R of the Inc/Dec control circuit 522) to be set is selected. 3. 1 is given to the test control signal 32, and the value of the SR or R selected in 2. is set by assuming the test control signal 31 as a serial input. 4. 2. and 3. are repeated until all of the values of the SR or R are set.

Next, an operation of the "test execution" will be explained. The operation of the "test execution" is to read/write (R/W) a data to the RAM. The presence of the Inc (Dec) of an address and the presence of R/W or a data reverse can be controlled in the "test execution".

When 1 is given to the test control signal 33, the Inc (Dec) of the value of the SR of the address generating circuit 520 is conducted, and when 0 is given, the Inc (Dec) is not conducted. The selection of the Inc or Dec is set in the R of the Inc/Dec control circuit 522 during the "test setting". When 1 is given to the test control signal 32, the writing to the RAM is conducted, and when 0 is given, the reading is conducted. When 1 is given to the test control signal 31, the reverse of the value of the SR of the data signal generating circuit 530 is conducted, and when 0 is given, it is not conducted.

A summary of the operation of the test circuit by means of a combination of the test control signals is shown in FIG. 2. An example of the operation in accordance with the operation contents shown in FIG. 2 will be mentioned below.

Figure 3:
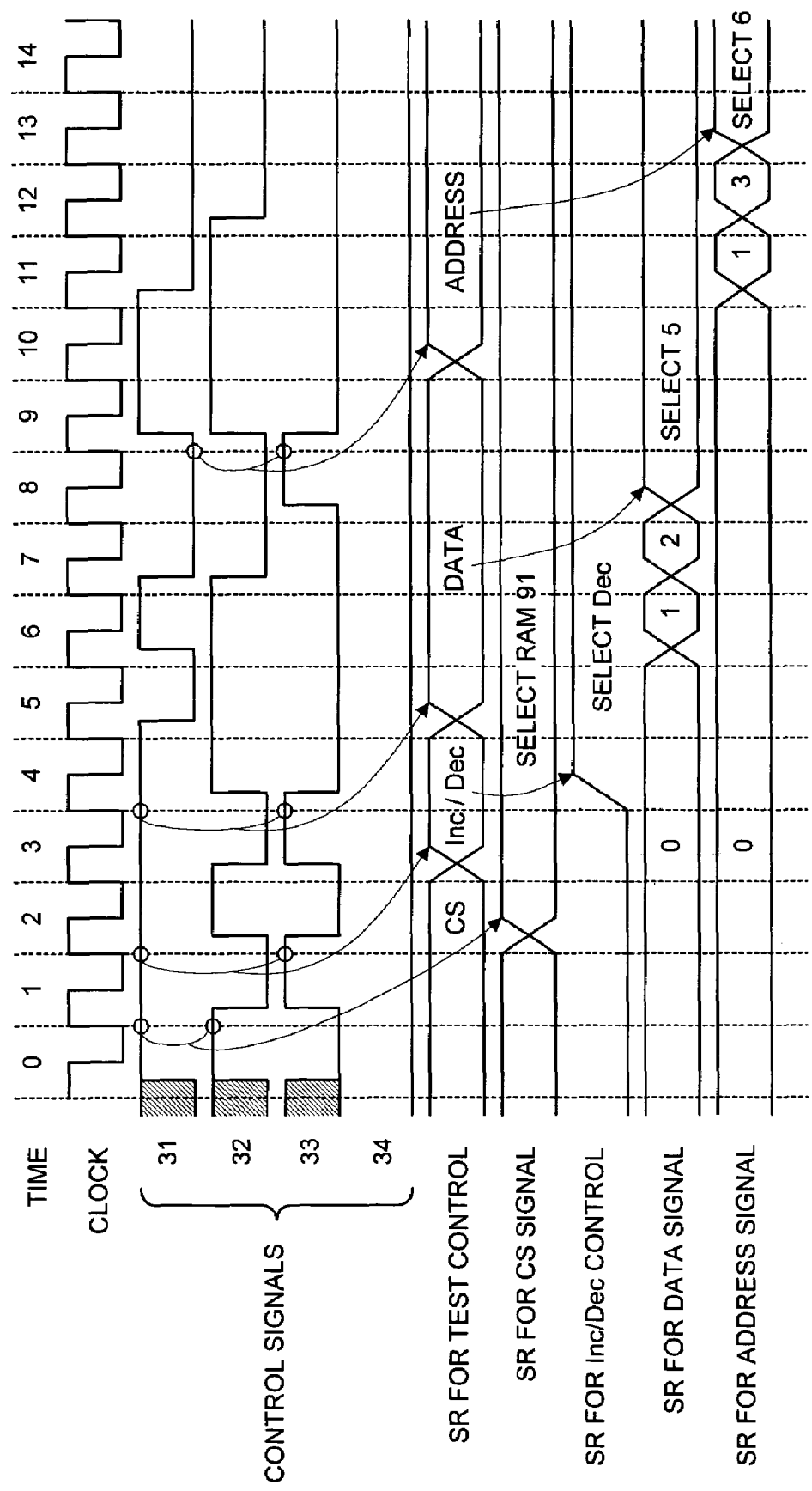
FIG. 3 is a timing chart showing an operation example of a "test setting" of the test circuit for the memory in accordance with an embodiment of the present invention.

First, an example of the operation of the "test setting" is shown in FIG. 3. By giving 0 to the test control signal 34, the "test setting" is established. At time 0, the SR of the test setting control circuit 560 selects (CS) the SR of the CS signal generating circuit. Here, when 1 is given to the test control signal 32, the value of the test control signal 31 is input to the SR of the CS signal generating circuit 510 by means of a serial input, and the value is set (The RAM 91 is selected.).

At time 1, when 1 is given to the test control signal 33, the value of the test control signal 31 is input to the SR of the test setting control circuit 560 by means of a serial input, and the value is set (Inc/Dec). At time 2, when 1 is given to the test control signal 32, the value of the test control signal 31 is input to the R of the Inc/Dec control circuit 522, and the value is set (Dec is selected.).

In the same manner, values 1, 0 and 1 of the test control signal 31 during rise of the clock 11 at time 5, 6 and 7 are input to the SR of the data signal generating circuit 530, and 5 (hexa-decimal) is set, and values 1, 1 and 0 of the test control signal 31 during rise of the clock 11 at time 10, 11 and 12 are input to the SR of the address signal generating circuit 520, and 6 (hexa-decimal) is set. Thereby, the setting is completed.

Figure 4:
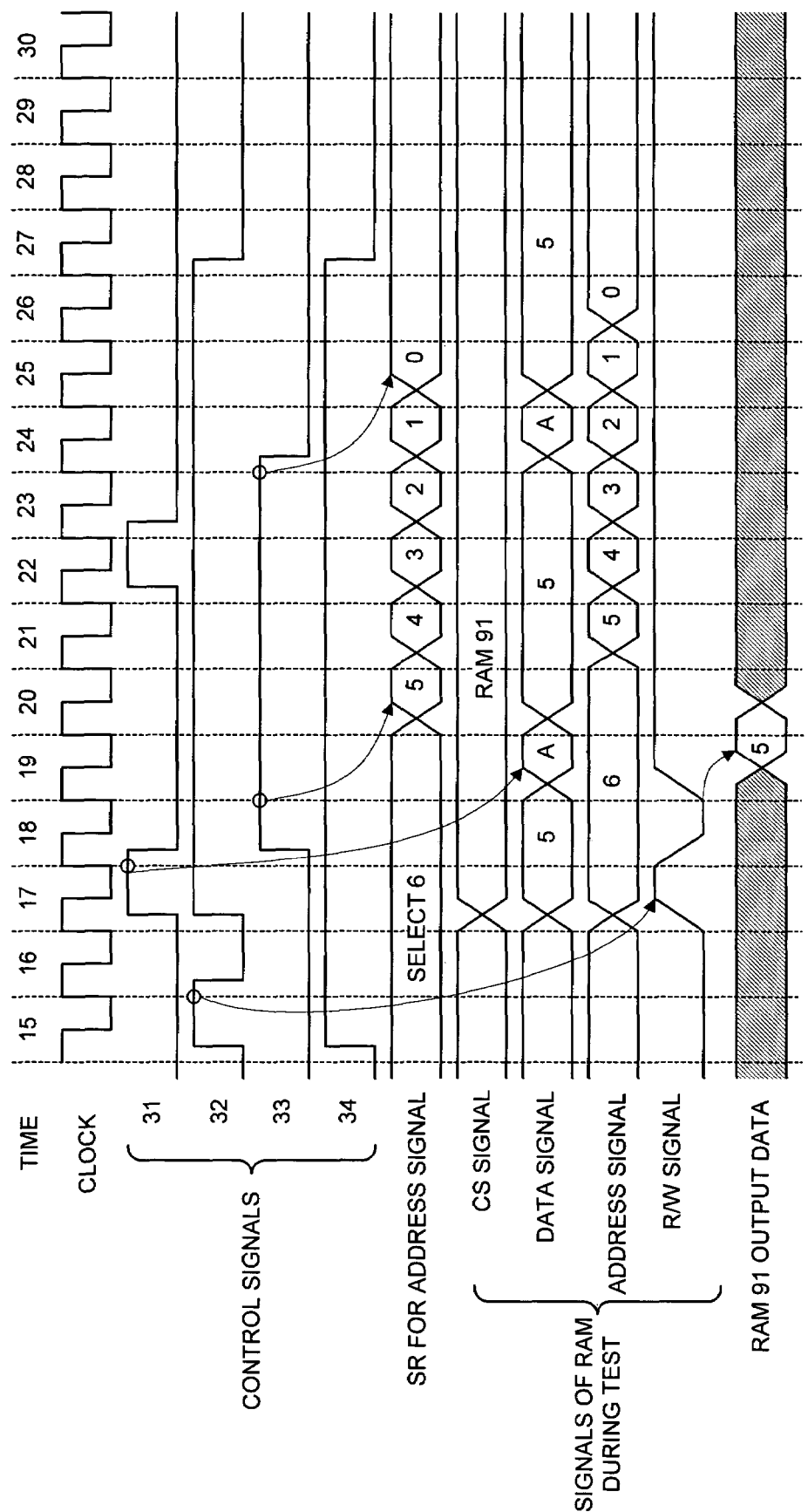
FIG. 4 is a timing chart showing an operation example of a "test operation setting" in the test circuit for the memory in accordance with an embodiment of the present invention.

Next, an example of the operation of the "test execution" is shown in FIG. 4. By giving 1 to the test control signal 34, the "test execution" is established, and a value set in each SR is output as a CS, data or address signal of the RAM. At time 15, when 1 is given to the test control signal 32, the R/W signal of the RAM becomes 1 (W). At time 17, when 1 is given to the test control signal 31, a value of the data signal of the RAM becomes a reversed value A (hexa-decimal). At time 18-24, when 1 is given to the test control signal 33, an address of the RAM is decremented.

As explained above, in the test circuit of the present invention, the test start address and the data to be written into the RAM can be freely set, and the timing of the read/write, the reverse of a data or the increment (decrement) of an address can be also freely operated.

In addition, although the explanation was made based on the embodiments, the test circuit of the memory of the present invention is not limited to the arrangements of the above-described embodiments, and circuits to which various changes from the arrangements of the above-described embodiments are applied are also included in the scope of the present invention. For example, although, in the embodiments, the explanation was made on the assumption that both of the number of memories to be tested and the bit width of the data signal are four, these numbers can be easily changed to arbitrary number.

The first advantage is that it is possible to change the test contents of the RAM by means of a small number of the external terminals. The reason thereof is that a serial input is used when a data necessary for the test is supplied from the outside, and a structure capable of controlling addressing, timing of R/W or the like from the external terminals is provided.

The second advantage is that it is possible to construct the test circuit of the RAM by means of a small number of hardware. The reason thereof is that it does not have a sequencer, a ROM code or the like for operating or determining the contents of the test inside the circuit, and it has an arrangement capable of operating the test contents by means of the minimum shift registers and a small number of logic inside the circuit, and a small number of the external terminals.

What is claimed is:

1. A semiconductor device comprising:
   a memory circuit provided in a semiconductor substrate; and
   a test circuit that tests said memory circuit in a test mode and is incorporated into said semiconductor substrate together with said memory circuit, said test circuit comprising:
   a test pattern register storing a test pattern data, said test pattern data being written in said memory circuit in said test mode;
   an address register storing an address data, said test pattern data being written in an address of said memory circuit indicated by said address data; and
   a first external terminal shared to receive serially said test pattern data and said address data,
   wherein said test circuit further comprises:
   a selection register storing a selection data, said selection data indicating which of said test pattern register and said address register receives data from said first external terminal.

2. The semiconductor device according to claim 1, wherein said first external terminal is shared to receive serially said selection data.

3. The semiconductor device according to claim 1, wherein said test circuit further comprises:
   an addressing register storing an addressing mode data, said addressing mode data indicating how said memory circuit is addressed to write said test pattern data.

4. The semiconductor device according to claim 3, wherein said addressing mode data indicates whether said address data is incremented or decremented.

5. The semiconductor device according to claim 3, wherein said first external terminal is shared to receive said addressing mode data.

6. The semiconductor device according to claim 1, wherein
said test mode has a test setting mode and a test executing mode,
in said test setting mode, said test pattern register and said address register receive said test pattern data and said address data respectively,
in said test executing mode, said test pattern register and said address register output data stored therein to said memory device,
said test setting mode is conducted when a test control signal input from a second external terminal has one logic state, and
said test executing mode is conducted when said test control signal has another logic state.

7. The semiconductor device according to claim 1, wherein said test circuit further comprises a reverse circuit outputting data in which the value of said test pattern data is reversed.

8. The semiconductor device according to claim 1, wherein said test pattern register and said address register are shift registers.

9. The semiconductor device according to claim 1, further comprising a second external terminal receiving a setting mode data,
wherein said test pattern register or said address register receives said test pattern data or said address data respectively from said first external terminal when said setting mode data has one logic state, and
said selection register receives said selection data from said first external terminal when said setting mode data has another logic state.

10. A semiconductor device comprising:
a memory circuit provided in a semiconductor substrate; and
a test circuit that tests said memory circuit in a test mode and is incorporated into said semiconductor substrate together with said memory circuit, said test circuit comprising:
a test pattern register storing a test pattern data, said test pattern data being written in said memory circuit;
a selection register storing a selection data, said selection data indicating whether said test pattern register is selected to receive said test pattern data; and
a first external terminal shared to receive serially said test pattern data and said selection data.

11. The semiconductor device according to claim 10, wherein said test circuit further comprises an addressing register storing an addressing mode data, said addressing mode data indicating how said memory circuit is addressed to write said test pattern data.

12. The semiconductor device according to claim 11, wherein said addressing mode data indicates whether said address data is incremented or decremented.

13. The semiconductor device according to claim 10, further comprising a second external terminal receiving a setting mode data,
wherein said test pattern register receives said test pattern data from said first external terminal, and
said selection register receives said selection data from said first external terminal when said setting mode data has another logic state.

* * * * *